United States Patent [19]
Nelson

[11] Patent Number: 6,091,307
[45] Date of Patent: Jul. 18, 2000

[54] RAPID TURN-ON, CONTROLLED AMPLITUDE CRYSTAL OSCILLATOR

[75] Inventor: Dale Harvey Nelson, Shillington, Pa.

[73] Assignee: Lucent Techmologies Inc., Murray Hill, N.J.

[21] Appl. No.: 09/124,431

[22] Filed: Jul. 29, 1998

[51] Int. Cl.$^7$ ........................................................ H03L 5/00
[52] U.S. Cl. ................. 331/109; 331/116 R; 331/117 R; 331/158; 331/144; 331/183
[58] Field of Search ................. 331/109, 113 R, 331/182, 183, 117 R, 116 R, 144, 145, 158

[56] References Cited

U.S. PATENT DOCUMENTS 3,899,753  8/1975  Malaviya ................................ 331/109

OTHER PUBLICATIONS

Aebischer, D; Oguey, HJ; Kaenel, VR, "A 2.1 MHz Crystal Oscillator Time Base with a Current Consumption under 500 nA", IEEE Journal of Solid–State Circuits, vol. 32, No. 7, Jul. 1997, pp. 999–1005.

Vittoz, EA; Degrauwe, MGR; Bitz, S, "High–Performance Crystal Oscillator Circuits: Theory and Application", IEEE Journal of Solid State Circuits, vol. 23, No. 3, Jun. 1988, pp774–782.

Lewyn, LL; Lucas, CH; Mulligan, JR, Jr., CMOS Oscillator Subsystem Optimized for Minimum Power Consumption, IEEE International Symposium on Circuits and Systems, 1983, pp. 513–526.

*Handbook of Piezoelectric Crystals for Radio Equipment Designers*, Wright Air Development Center, Oct. 1956, pp. 218–222.

*Primary Examiner*—Arnold Kinkead

[57] ABSTRACT

A crystal tank circuit is connected between the ac cross-coupled outputs of two transistors that are selectively biased to an appropriate common mode voltage to cause rapid build-up of oscillation when the circuit is turned on and in which oscillation is sustained in the desired mode regardless of battery voltage fluctuation without wasting power. The differentially driven frequency-controlling crystal tank circuit receives balanced driving voltage excursions from the circuit.

9 Claims, 2 Drawing Sheets

RAPID TURN-ON, CONTROLLED AMPLITUDE CRYSTAL OSCILLATOR

FIELD OF THE INVENTION

This invention relates to crystal controlled oscillator circuits and more particularly, to a power conserving oscillator circuits.

BACKGROUND OF THE INVENTION

When two transistors are cross-coupled by a dc path they may be used to create a flip-flop and, when properly cross-coupled by an R-C network, they may be used to create a multivibrator whose frequency of oscillation is determined by the R-C network's time constant. If the charging time of the capacitor can be varied by changing the input voltage a so-called voltage-controlled oscillator results. Instead of an R-C network, an LRC tank circuit may used to establish the frequency of oscillation and a crystal may be used to provide enhanced stability. To sustain oscillation, a transistor amplifier may be used to provide sufficient negative resistance to match the internal positive resistance of the tank circuit. If the tank circuit is in the feedback path its series resonant frequency is of principal importance in establishing the frequency of oscillation. However the crystal may be in either parallel or series resonance with the input impedance of the first stage, each mode generating a different frequency. See, for example, *A Handbook of Piezoelectric Crystals for Radio Equipment Designers*, Wright Air Development Center, Wright-Patterson Air Force Base, Ohio, July 1957, pp. 218–222. In addition, the feedback transistor's transconductance can not be too high or the oscillations may build up exponentionally and unpredictably from any noise input. Accordingly, oscillation build-up must be controlled.

As disclosed in an article entitled *A High-Performance Crystal Oscillator Circuits: Theory and Application* by Eric A. Vitoz and Marc G. R Degrauwe, IEEE Journal of Solid-State Circuits, vol. 23, no. 3, June 1988, pp. 774–782, a crystal may be represented by an equivalent electrical circuit in which each possible mode (i) of mechanical oscillation corresponds to a resonant circuit with the parameters $L_i$, $R_i$ and $C_i$ having a motional impedance $Zm_i$. To prevent undesired modes of crystal oscillation, the applied voltage must be maintained within appropriate limits.

There are several disadvantages to connecting the crystal at the input terminals of single transistor amplification stage with feedback. First, the voltage that is fed back to drive the crystal cannot exceed that of the battery supply voltage. Second, each side of the crystal sees a different circuit impedance so that any noise in the battery supply will be applied to the crystal tank circuit as a noise signal and will be amplified. These problems are partially alleviated by employing a two-transistor differential amplifier and by connecting the crystal between the inputs, or preferably, between the outputs of the two transistors. When the differentially connected transistors share a common constant current battery supply source any battery noise is cancelled. Moreover, when the crystal is connected between the differential outputs it may be subjected to maximum battery drive first in one direction and then in the other, thereby effectively experiencing twice the voltage swing of the single-transistor connection. While the differentially-connected, crystal- controlled multivibrator is an efficient and useful circuit, in certain applications, such as in hand-held radiotelephones where battery voltage may vary and power consumption must be minimized, it is important to rapidly bring the crystal tank circuit into an appropriate mode of oscillation when the circuit is turned on and then to sustain oscillation in that mode without overdriving the crystal and wasting power.

SUMMARY OF THE INVENTION

In accordance with the principles of the present invention, in one illustrative embodiment thereof, a crystal tank circuit is connected between the ac cross-coupled outputs of two transistors that are selectively biased to an appropriate common mode voltage to cause rapid build-up of oscillation when the circuit is turned on and in which oscillation is sustained in the desired mode regardless of battery voltage fluctuation without wasting power. The differentially driven frequency-controlling crystal tank circuit receives balanced driving voltage excursions from the circuit.

BRIEF DESCRIPTION OF THE DRAWING

The foregoing and other features of the present invention may become more apparent when the ensuing description is read together with the drawing, in which.

GENERAL DESCRIPTION

Figure 1:
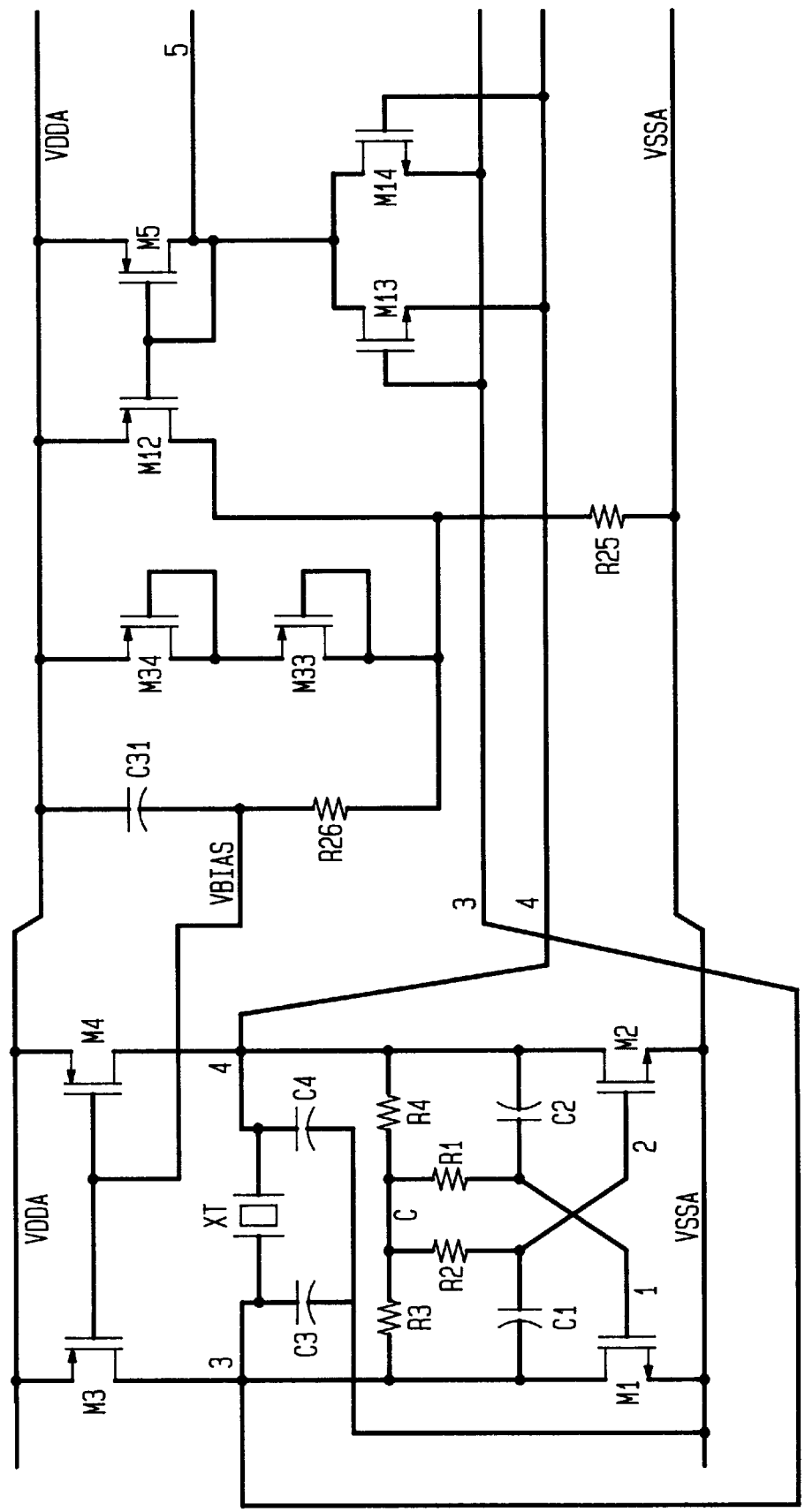
FIG. 1 shows the cross-coupled transistors and bias control circuitry of the invention.

In FIG. 1 transistors M1 and M2 have their source-drain path in series, respectively, with opposite conductivity type transistors M3 and M4 and common battery supply Vdda. Since the gates of transistors M3 and M4 are connected together and since their sources are connected together, their source-drain currents will be equal if transistors M3 and M4 are identical devices. The gate drive to transistors M3, M4 will be described in detail hereinafter.

The gate electrode of transistor M1 is ac cross coupled by resistor capacitor network C2, R1 to the drain electrode of transistor M2 and the gate electrode of transistor M2 is ac cross coupled to the drain electrode of transistor M1 by resistor capacitor network C1, R2. The ends of resistors R1 and R2 that are not connected to the gate electrodes are connected together to the junction of resistors R3 and R4 which the other ends of which are connected, respectively, to the drains of transistors M1, M3 and M2, M4. Resistors R3 and R4 form a midpoint for resistors R1 and R2 to use as an average bias point. The average bias of transistors M1 and M2 can then be adjusted by the voltage applied to lead VBIAS which sets the oscillator common mode voltage. By controlling the potential of lead VBIAS, the oscillator uses only enough bias to sustain oscillation.

Crystal XT is connected at one end to the drains of series-connected transistors M1, M3 and at the other to the drains of series-connected transistors M2, M4. Transistors M1, M2 form a cross-coupled differential feedback amplifier that drives crystal XT. By-pass capacitors C3, C4 connect each end of crystal XT to ac ground and compensate for the R-C time constants of cross-coupling networks R2, C1 and R1, C2 that otherwise might determine a low frequency multivibrator operation in transistors M1, M2. In other words, the time constant of C1, R2 (also, C2, R1) must be longer than the desired period of oscillation.

As mentioned above, the gates of biasing transistors M3 and M4 are commonly connected via lead VBIAS to a bias control arrangement. In the bias control arrangement, lead VBIAS is connected to the junction of resistor R26 and capacitor C31. The other end of capacitor C31 is connected to voltage supply Vdda and the other end of resistor R26 is connected to resistor R25 which normally pulls the potential on lead VBIAS toward the potential of lead Vssa which is nominally at zero volts. With lead VBIAS at zero volts the bias drive to the gates of transistors M3 and M4 is at maximum. Actually, diode-connected transistors M33 and M34 prevent the voltage on lead VBIAS from going lower than two source drain voltage drops above zero, thereby limiting the maximum drive to transistors M3, M4. Accordingly, if the circuit has just been turned on by a switch (not shown) which applies battery Vdda, the maximum permitted source-drain current flows through transistors M3 and M4. However, clamping transistors M33, M34 prevent excessively large battery current drain during the start up. With the bias on lead VBIAS allowing maximum permitted current to be delivered through transistors M3, M4, the oscillator circuit comprising transistors M1, M2 and crystal tank XT is strongly in the right half plane, thereby allowing oscillation amplitude rapidly to be built up.

The build up of oscillation amplitude is sensed at the drain electrodes of transistors M1, M2, i.e., nodes 3, 4, respectively, by the gate electrodes of transistors M13, M14. As the differential amplitude builds up, transistors M13, M14 will begin to conduct on the peak swing of the signal. The drain electrodes of transistors M13, M4 are connected together to the current mirror circuit comprising transistors M5, M12. The current through transistors M13, M14 flows through transistor M5 of the current mirror which determines the current through transistor M12. Transistor M12 determines the current flowing through resistor R25. With resistor R25 now carrying current, the voltage on lead VBIAS rises above the minimum allowed by diode-connected transistors M33, M34, thereby reducing the drive to transistors M3, M4 which supply current to the oscillator transistors M1, M2. Reducing the drive to the oscillator transistors reduces the amplitude of oscillation to a value determined by the now-controlled potential on lead VBIAS. Ideally, the drive now supplied will drive the operating point for the oscillator toward the condition where the real part of the complex pole is zero. If the operating point is momentarily driven to the left half plane, the oscillation amplitude will decrease, causing transistors M13, M14 to stop conducting on the peak excursions of the oscillation. With transistors M13, M14 not conducting, resistor R25 will increase the bias on lead VBIAS, causing the poles to move toward the right half plane and restoring oscillation. Resistor R26 and capacitor C31 filter the input of the bias voltage applied to lead VBIAS to stabilize operation in the event that if current mirror M5, M12 turned on too rapidly, the bias voltage on lead VBIAS would not be so precipitously reduced as to halt oscillation.

Figure 2:
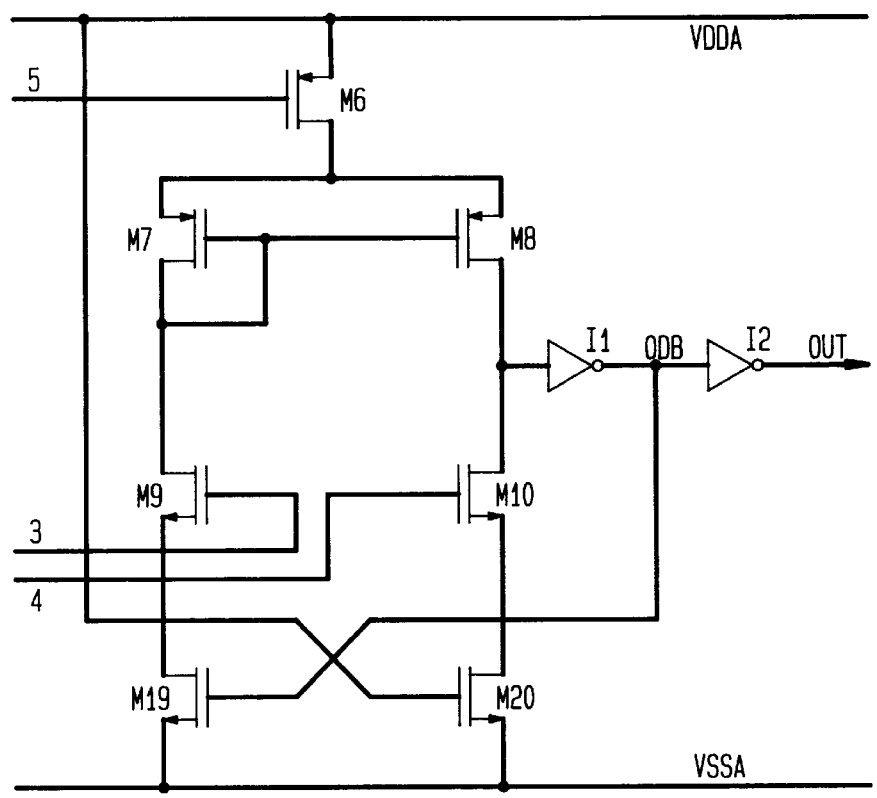
FIG. 2 shows a circuit for converting the differential oscillations of FIG. 1 to a single-ended output.

Referring now to FIG. 2 there is shown an output circuit for converting the differential oscillations appearing on leads 3 and 4 of FIG. 1 FIG. 1 to a single-ended output for use in those applications desiring such an output. The circuit operates as follows. Initially, transistor M6 is off, causing the input of inverter I1 to be low and its output ODB to be high. When the output of inverter I1 is high the output signal of inverter I2 applied to lead OUT will be low. As the oscillations build in the oscillator of FIG. 1, transistor M10 will conduct and keep the input to inverter I1 low. As long as transistor M6 is off, current mirror M7, M8 will be ineffective. When the amplitude of oscillation is sufficient to turn on transistors M13, M14 of FIG. 1, lead 5 will be pulled down to turn on transistor M6, making the current mirror transistors M7, M8 active. The next half cycle when lead 3 goes positive, transistor M9 will conduct and the input to inverter I1 will be pulled high by mirror M7, M8. To prevent unneeded current draw through transistors M6, M7 and M9 after the input to inverter I1 has been pulled high, transistor M19 will be turned off by lead ODB going low. Transistor M20 is included to improve the duty cycle by making conduction through transistor M10 match the conduction of transistors M9 and M19. On the next half cycle, lead 4 will go high and transistor M10 will conduct, pulling the input to inverter I1 low. The cycle then repeats itself.

Figure 3:
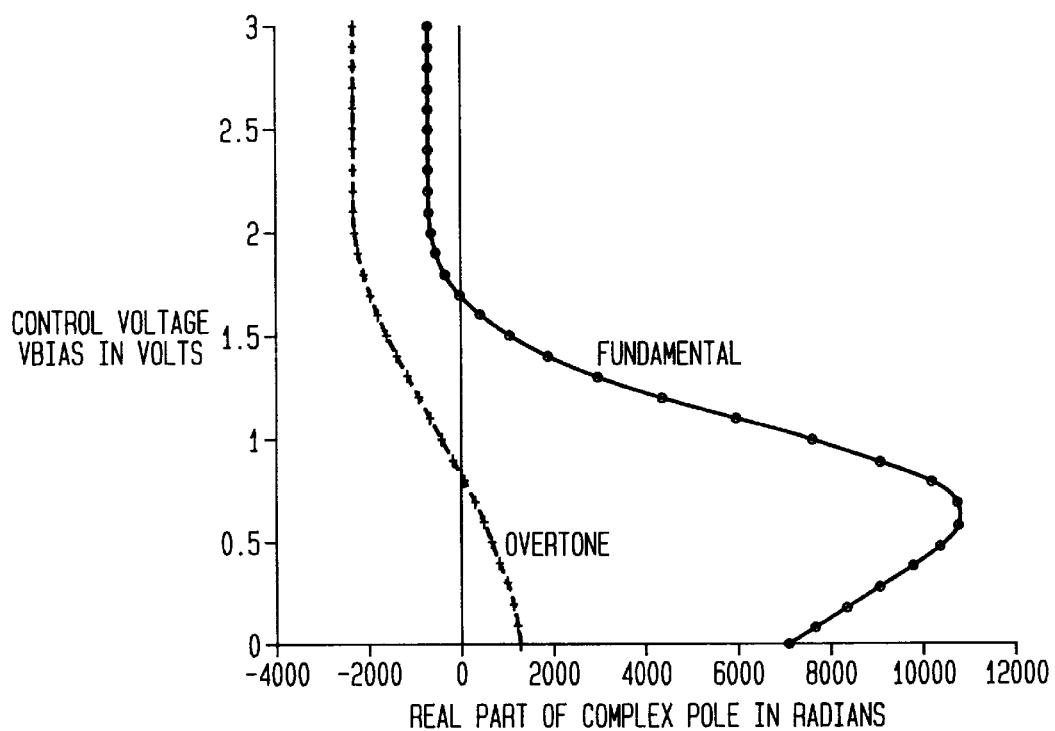
FIG. 3 shows a plot of the real component of complex pole variation with control voltage bias.

In FIG. 3 the real part of the fundamental pole and the real part of the overtone pole as a function of the control voltage bias on lead VBIAS is shown. This plot is for an illustrative embodiment where Vdd was 3 volts using nominal MOS transistors and ideal resistors and capacitors. Since VBIAS connects to gates of P-channel MOS devices with a source at 3 volts, the bias current is a maximum at VBIAS=0, and goes to zero at about 2 volts. Note that with this circuit, the overtone curve is to the left of the fundamental. The target is to adjust the bias so the fundamental is at zero while oscillating. For this voltage, the overtone is suppressed. Note also that the illustrative curve tends to fall back toward the left half for high bias current conditions approximately corresponding to a VBIAS of less than 0.75 volts. In some cases this may determine that the fundamental pole may be in the left half plane for VBIAS less than 1.0 volts. However, the clamp circuit of transistors M34 and M35 prevents VBIAS from being more than 1.5 volts below the Vdd supply rail always insuring that the circuit is strongly in the right half plane for the start up of oscillation.

What has been described is deemed to be illustrative of the principles of the invention Numerous other modifications may be made by those skilled in the art without, however, departing from the spirit and scope of the invention.

What claimed is:

1. A multivibrator having a pair of cross-connected transistors, comprising:
   a. first and second series-connected resistors (R26, R25) for applying a bias to initiate oscillation of said transistors;
   b. a circuit (M12, M5, M13, M14) for applying a current through one of said resistors proportional to a peak amplitude of oscillation of said transistors; and
   c. a circuit (M33, M34) for limiting a maximum current through said one of said resistors to limit a maximum amplitude of oscillation.

2. A multivibrator according to clam 1 including a frequency-defining tank circuit connected between corresponding electrodes of said cross-connected transistors.

3. An oscillator circuit comprising:
   a. a frequency-defining tank circuit linking a pair of cross-coupled transistors; and
   b. a pair of transistors of opposite conductivity type to said cross-coupled transistors for determining the bias to said cross-coupled transistors; and
   c. an oscillation amplitude sensing circuit for controlling the bias of said opposite-conductivity type transistors.

4. An oscillator circuit according to claim 3 wherein corresponding electrodes of said pair of transistors for determining said bias of said cross-coupled transistors are connected to a biasing resistor and wherein said oscillation amplitude sensing circuit controls the current through said biasing resistor to control the amplitude of oscillation of said cross-coupled transistors.

5. An oscillator circuit according to claim 3 further including means for clamping a maximum potential that can be developed across said biasing resistor.

6. An oscillator circuit according to claim 3 wherein said oscillation amplitude-sensing circuit includes a resistor for providing maximum bias to the gates of said opposite-conductivity type transistors when said pair of transistor are first supplied with power and a current supply circuit controlled by the amplitude of oscillation for regulating the current through said resistor in accordance with said amplitude.

7. An oscillator circuit according to claim 6 wherein said current supply circuit includes a current mirror circuit for sending current through said resistor in accordance with the amplitude of oscillation.

8. An oscillator circuit according to claim 7 wherein said current supply circuit includes clamping means for limiting a maximum drive to said opposite-conductivity type transistors by providing a minimum current through said resistor.

9. An oscillator circuit according to claim 8 wherein said clamping means includes a capacitor for opposing a rapid change in current through said resistor.

* * * * *